US010301718B2

(12) United States Patent
Blaquiere et al.

(10) Patent No.: US 10,301,718 B2
(45) Date of Patent: May 28, 2019

(54) ASYMMETRIC PEDESTAL/CARRIER RING ARRANGEMENT FOR EDGE IMPEDANCE MODULATION

(71) Applicant: Lam Research Corporation, Fremont, CA (US)

(72) Inventors: Ryan Blaquiere, Portland, OR (US); Ramesh Chandrasekharan, Portland, OR (US); Shankar Swaminathan, Beaverton, OR (US); Yukinori Sakiyama, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 439 days.

(21) Appl. No.: 15/077,844

(22) Filed: Mar. 22, 2016

(65) Prior Publication Data

US 2017/0275756 A1 Sep. 28, 2017

(51) Int. Cl.
*H01L 21/687* (2006.01)
*C23C 16/455* (2006.01)
*H01L 21/67* (2006.01)

(52) U.S. Cl.
CPC .... *C23C 16/45544* (2013.01); *H01L 21/6719* (2013.01); *H01L 21/67201* (2013.01); *H01L 21/68735* (2013.01); *H01L 21/68742* (2013.01); *H01L 21/68757* (2013.01); *H01L 21/68771* (2013.01)

(58) Field of Classification Search
CPC .................................................. H01L 1/68721
See application file for complete search history.

(56) References Cited

U.S. PATENT DOCUMENTS

| | | | | |
|---|---|---|---|---|
| 5,292,399 A | * | 3/1994 | Lee | H01L 21/67069 156/345.47 |
| 5,632,873 A | * | 5/1997 | Stevens | C23C 14/50 118/503 |
| 2001/0050265 A1 | * | 12/2001 | Cohen | H01J 37/321 216/13 |
| 2004/0261946 A1 | * | 12/2004 | Endoh | H01J 37/32082 156/345.15 |

(Continued)

*Primary Examiner* — Joseph A Miller, Jr.
(74) *Attorney, Agent, or Firm* — Penilla IP, APC

(57) ABSTRACT

Pedestal assemblies and methods for using said pedestal assemblies, used in processing chambers implemented for processing substrates are disclosed. In one example, the pedestal assembly includes a center column coupled to a lower chamber body of a processing chamber. A pedestal body is coupled to the center column. The pedestal body includes a substrate support surface and an annular step formed around a circumference of the pedestal body and surrounding the substrate support surface. Further included is a first annular ring segment disposed within the annular step. The first annular ring is defined from a conductive material. A second annular ring segment is also disposed within the annular step. The second annular ring is defined from a dielectric material. The first annular ring and the second annular ring fill the annular step around the circumference of the pedestal body. The first and second annular rings provide a fill that surrounds the substrate support and acts to modify an impedance for improving azimuthal uniformity of films deposited over the substrate using the processing chamber.

15 Claims, 8 Drawing Sheets

(56) References Cited

U.S. PATENT DOCUMENTS

2005/0230049 A1* 10/2005 Nishio .............. H01J 37/32082
                                                      156/345.51
2010/0193132 A1*  8/2010 Wi .................... H01L 21/6719
                                                      156/345.51

* cited by examiner

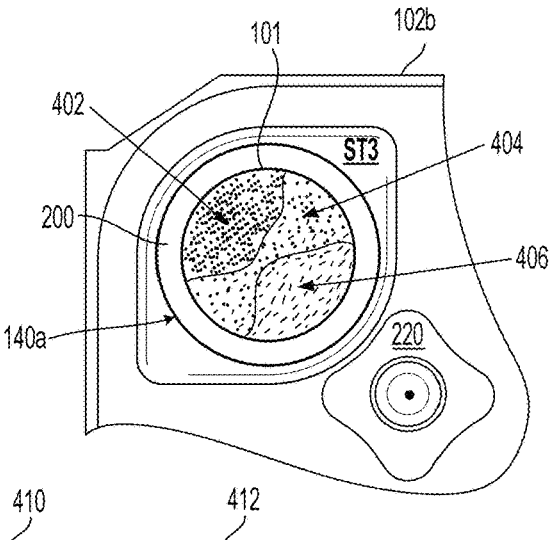

FIG. 4A

| Metal Fill<br>Under Region of<br>Carrier Ring | Ceramic Fill<br>Under Region of<br>Carrier Ring | Air Gap<br>Under Region of<br>Carrier Ring |
|---|---|---|
| Reduces Impedance to ground | Increases Impedance to ground | Increases Impedance to ground |
| Increase Plasma Density | Reduces Plasma Density | Reduces Plasma Density |
| Reduces Film Thickness<br><br>(in some systems, increases film thickness) | Increases Film Thickness<br><br>(in some systems, decreases film thickness) | Increases Film Thickness<br><br>(in some systems, decreases film thickness) |

FIG. 4B

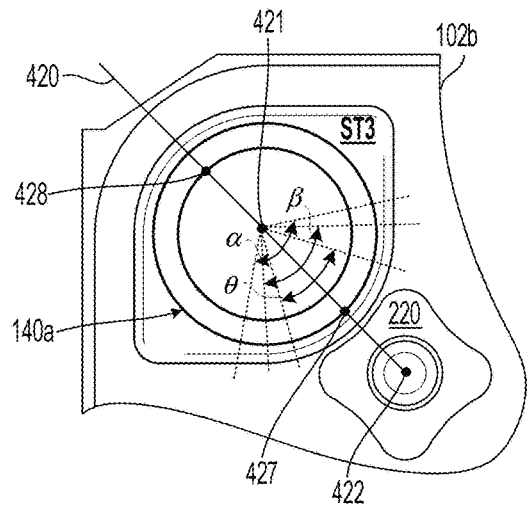

FIG. 4C

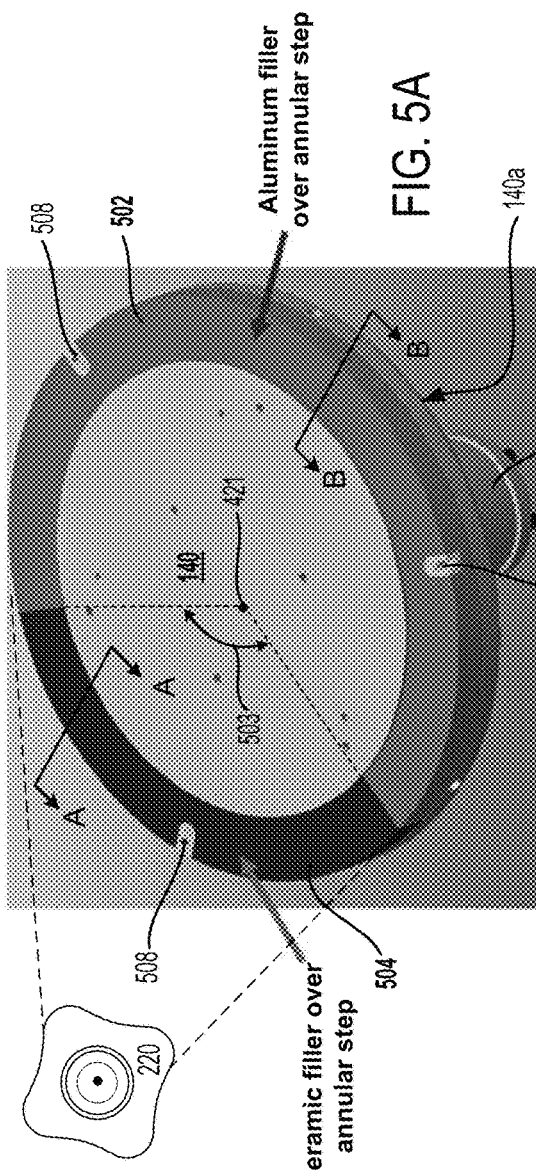
FIG. 5A
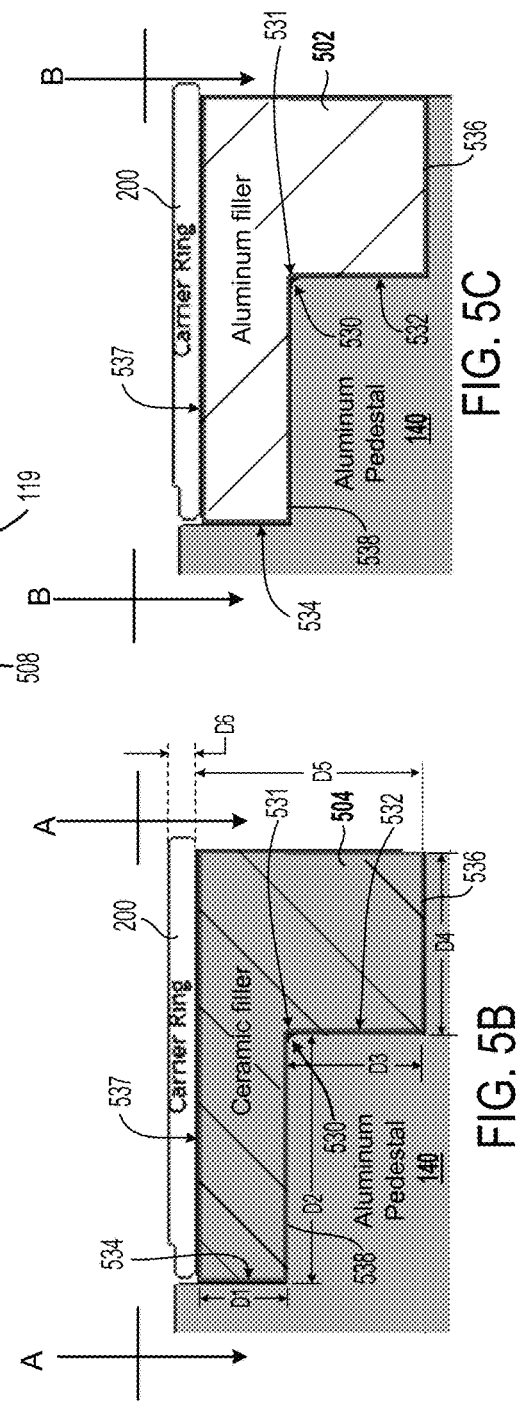
FIG. 5B
FIG. 5C

ASYMMETRIC PEDESTAL/CARRIER RING ARRANGEMENT FOR EDGE IMPEDANCE MODULATION

FIELD OF THE DISCLOSURE

The present embodiments relate to semiconductor wafer processing equipment tools, and more particularly, multi-station chambers with pedestal surrounding structures for improving wafer film uniformity.

BACKGROUND

There are many types of film deposition processes commonly used in the semiconductor fabrication field. One example process is referred to as a plasma-enhanced chemical vapor deposition (PECVD), which is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor.

Another example film deposition process is referred to as atomic layer deposition (ALD), which also utilizes plasma energy to facilitate the deposition. ALD systems are used to produce very thin films that are highly conformal, smooth, and possess excellent physical properties. ALD uses volatile gases, solids, or vapors that are sequentially introduced (or pulsed) over a heated substrate. A first precursor is introduced as a gas, which is absorbed (or adsorbed) into the substrate and the reactor chamber is cleared of the gaseous precursor. A second precursor is introduced as a gas, which reacts with the absorbed precursor to form a monolayer of the desired material. By regulating this sequence, the films produced by ALD are deposited a monolayer at a time by repeatedly switching the sequential flow of two or more reactive gases over the substrate.

Chambers used to process PECVD and ALD processes require highly engineered structural construction so that the resulting films deposited on substrates are as uniform as possible and processes are repeatable from wafer-to-wafer. In such chambers, radio frequency (RF) power is supplied to enable excitation of gases in the form of a plasma, which leads to the deposition of a material film. The delivery of RF power is typically applied to either the substrate support (i.e., the pedestal) or the showerhead. In either configuration, RF power applied to the chamber needs to have an RF return to ground. Commonly, the chamber walls are grounded and RF power turns to ground via one or more conductive paths.

This process has worked well for some time, but as the demand continues to push for the manufacture of smaller feature sizes, more stringent demands are continually made upon chamber construction and engineered geometries. For example, some chamber designs usable for PECVD as well as ALD include multi-station designs. Multi-station designs are those that enable deposition processes to occur in multiple stations at the same time.

Such multi-station designs have added complexities associated with a spindle used to transfer wafers among the stations. The spindle is typically located in a center location, which places it adjacent to one side of a specific station. Unfortunately, for some processes, azimuthal non-uniformities in films deposited over the substrate may be introduced as influenced by the adjacent spindle.

It is in this context that inventions arise.

SUMMARY

Embodiments of the disclosure provide embodiments of a process chamber, used for processing semiconductor wafers. In one implementation, a processing chamber includes two or more pedestal assemblies, wherein each pedestal assembly is placed adjacent to a spindle. To counteract azimuthal non-uniformities in deposited films, as caused by the non-symmetric relationship of the spindle to each pedestal assembly, the pedestal assembly is designed with an annular step, which can be filled with two or more annular segments. The annular segments are placed in the annular step in specific locations to influence or modify the impedance to ground, e.g., based on the material properties of the annular segment. The annular segment, for example, can be metallic, e.g., aluminum, which can act to reduce the impedance to ground. The annular segment, for example, can be dielectric, e.g., ceramic, which can act to increase the impedance to ground. Increasing the impedance can act to reduce the plasma density. Decreasing the impedance can act to increase plasma density. Thus, by selecting the filler material of the annular segments, locating the annular segments in specific regions of the annular step of the pedestal body, it is possible to counteract or account for azimuthal non-uniformities caused by specific deposition processes or simply to cancel out the non-symmetric impact of the adjacent spindle.

In one embodiment, these disclosed solutions involve creating asymmetric impedance on the pedestal/carrier ring arrangement to influence the impedance in local areas around the circumference of the wafer. One way of doing this is by reducing the profile of the aluminum pedestal (e.g., by forming an annular step) and adding in filler parts of differing material in different zones. Thickness and material type of the filler parts influences the electrical impedance. Metal fillers provide a low impedance path to ground, while dielectric material (ceramic or vacuum) filler plates provide significantly higher impedance. In some tests, process data shows that a zone of thinner or thicker deposition in approximately a 120 degree arc biased toward the spindle of the chamber. This would indicate that zone has a higher or lower plasma density than the converse zone. For instance, adding ceramic filler to this zone will increase the impedance to ground, thus reducing the plasma density in that zone compared to the remainder of the pedestal. Alternately, no filler could be added in the 120 degree arc, which would introduce a vacuum gap and higher impedance to ground.

Pedestal assemblies and methods for using said pedestal assemblies, used in processing chambers implemented for processing substrates, are disclosed. In one example, the pedestal assembly includes a center column coupled to a lower chamber body of a processing chamber. A pedestal body is coupled to the center column The pedestal body includes a substrate support surface and an annular step formed around a circumference of the pedestal body and surrounding the substrate support surface. Further included is a first annular ring segment disposed within the annular step. The first annular ring is defined from a conductive material. A second annular ring segment is also disposed within the annular step. The second annular ring is defined from a dielectric material. The first annular ring and the second annular ring fill the annular step around the circumference of the pedestal body. The first and second annular rings provide a fill that surrounds the substrate support and acts to modify an impedance for improving azimuthal uniformity of films deposited over the substrate using the processing chamber.

In some embodiments, the annular step includes a set of supports, and either or both of the first annular ring or the second annular ring is formed to enable ones of the set of substrate supports to fit therein. The set of supports are configured to support a carrier ring, and the carrier ring is configured to sit over the first annular ring and the second annular ring.

In some embodiments, the annular step includes a set of supports, and either or both of the first annular ring or the second annular ring is formed to enable ones of the set of substrate supports to fit therein. The set of supports are configured to support a focus ring, and the focus ring is configured to sit over the first annular ring and the second annular ring.

In some embodiments, the processing chamber includes a spindle. The spindle is used to move substrates onto and off of the substrate support surface.

The pedestal body is disposed in the processing chamber in an adjacent relationship to the spindle, such that a center of pedestal body and a center of the spindle are positioned along an axis.

In some embodiments, the second annular ring segment is centered about a proximal side of the pedestal body along the axis that is adjacent to the spindle and the first annular ring segment is centered about a distal side of the pedestal body along the axis that is opposite the spindle.

In some embodiments, the first annular ring segment is centered about a proximal side of the pedestal body along the axis that is adjacent to the spindle and the second annular ring segment is centered about a distal side of the pedestal body along the axis that is opposite the spindle.

In some embodiments, the first annular ring segment being defined from the conductive material reduces an impedance to ground and influences an increase in plasma density over a region of the substrate that is proximate to the first annular ring segment when the film is deposited over the substrate in the processing chamber.

In some embodiments, the second annular ring segment being defined from the dielectric material increases impedance to ground and influences a reduction in plasma density over a region of the substrate that is proximate to the second annular ring segment when the film is deposited over the substrate in the processing chamber.

In some embodiments, the second annular ring segment has an arc that is between 80 and 160 degrees and the first annular ring segment has an arc that completes 360 degrees, such that the first and second annular ring segments fill the annular step.

In some embodiments, the processing chamber includes a spindle. The spindle is used to move substrates onto and off of the substrate support surface. The pedestal body is disposed in the processing chamber in an adjacent relationship to the spindle, such that a center of the pedestal body and a center of the spindle are positioned along an axis. The second annular ring segment is centered about a proximal side of the pedestal body along the axis that is adjacent to the spindle, and the first annular ring segment is centered about a distal side of the pedestal body along the axis that is opposite the spindle.

In some embodiments, first annular ring segment being defined from the conductive material reduces an impedance to ground and influences an increase in plasma density over a region of the substrate that is proximate to the first annular ring segment when the film is deposited over the substrate in the processing chamber, and wherein the second annular ring segment being defined from the dielectric material increases an impedance to ground and influences a reduction in plasma density over a region of the substrate that is proximate to the second annular ring segment when the film is deposited over the substrate in the processing chamber.

In some embodiments, the second annular ring segment has an arc that is about 120 degrees.

In some embodiments, the first annular segment is defined by a plurality of sub-first annular segments.

In some embodiments, the second annular segment is defined by a plurality of sub-second annular segments.

In some embodiments, the carrier ring includes an air gap in a lower region that faces the pedestal body, the air gap being defined along an arc region around the pedestal body.

In some embodiments, the processing chamber includes a spindle. The spindle is used to move substrates onto and off of the substrate support surface. The pedestal body is disposed in the processing chamber in an adjacent relationship to the spindle, such that a center of the pedestal body and a center of the spindle are positioned along an axis. The arc region is located adjacent to the spindle and centered about the axis.

In some embodiments, the first and second annular rings have an annular opposing step that mate with the annular step of the pedestal body.

In some embodiments, the first and second annular rings have a top surface that is spaced below the substrate support surface, and a carrier ring or focus ring is located over the first and second annular rings.

In some embodiments, the processing chamber is a multi-station chamber that includes four of said pedestal assembly. A spindle is centrally located between each of the four pedestal assemblies. And, the second annular ring segments of each of the four pedestal assemblies are positioned adjacent to the spindle and the first annular ring segments of each of the four pedestal assemblies are positioned opposite the spindle.

In one embodiment a method for configuring a pedestal assembly used to process a substrate is disclosed. The pedestal assembly is disposed in a processing chamber and a spindle used to move substrates onto and off of the pedestal assembly is located adjacent to a side of the spindle. The method includes providing an annular step around a circumference of the pedestal body so as to surround a substrate support surface of the pedestal body. The method further includes fitting a first annular ring segment within the annular step, such that the first annular ring is defined from a conductive material. Further, the method includes fitting a second annular ring segment within the annular step. The second annular ring is defined from a dielectric material, such that one of the first or second annular ring segments is located adjacent to the spindle. The first annular ring segment being defined from the conductive material reduces an impedance to ground and influences an increase in plasma density over a region of the substrate that is proximate to the first annular ring segment when the film is deposited over the substrate in the processing chamber. The second annular ring segment being defined from the dielectric material increases an impedance to ground and influences a reduction in plasma density over a region of the substrate that is proximate to the second annular ring segment when the film is deposited over the substrate in the processing chamber.

In some embodiments, the method includes placing the second annular ring segment adjacent to the spindle and the first annular ring segment opposite the spindle, such that the second annular ring segment increases the impedance to ground to influence the reduction in plasma density over the region of the substrate that is proximate to the spindle. The increase in the impedance assists in compensating a non-uniformity caused by a non-symmetric positioning of pedestal assembly adjacent to the side of the spindle.

In some embodiments, the method includes selecting an arc size of the first and second annular ring segments based on a size of the region of the substrate that is to be affected by the increase or decrease of the impedance.

In some embodiments, the size of the arc of the second annular ring segment is between 80 and 160 degrees and the first annular ring segment has the size of the arc that completes 360 degrees, such that the first and second annular ring segments fill the annular step.

In some embodiments, the method includes placing the first annular ring segment adjacent to the spindle and the second annular ring segment opposite the spindle, such that the first annular ring segment decreases the impedance to ground to influence the increase in plasma over the region of the substrate that is proximate to the spindle. The decrease in the impedance assists in compensating a non-uniformity caused by a non-symmetric positioning of pedestal assembly adjacent to the side of the spindle.

One advantage of this hardware set over the traditional pedestal configuration is that it allows a near infinite configurability of the edge impedance of the pedestal. This has the impact of allowing engineering to fine tune impedance in specific zones to achieve specific results. This will allow engineering to smooth out the non-uniform (NU) profile that may be seen in the baseline hardware. This is a feature that was not achievable with baseline hardware.

BRIEF DESCRIPTION OF THE DRAWINGS

FIG. 4A illustrates a top view of a segment of the lower chamber body, with one of the pedestal assemblies showing non-uniformities of deposited films over substrate.

FIG. 4B illustrates influencing properties associated with materials used to fill or defined the region under the carrier ring, around the pedestal body, in accordance with one embodiment.

FIG. 4C illustrates a section of the lower chamber body, that defines an axis extending between a center of the pedestal body and a center of the spindle, in accordance with one embodiment.

FIG. 5A illustrates a three-dimensional diagram of the pedestal body, having a first annular segment and a second annular segment, in accordance with one embodiment.

FIGS. 5B-5F illustrate example cross-sectional views of the annular step formed in the pedestal body and the annular segments used as filler to modify an impedance to ground as seen by a deposition plasma when depositing a film over a wafer, in accordance with one embodiment.

DESCRIPTION

Figure 1:
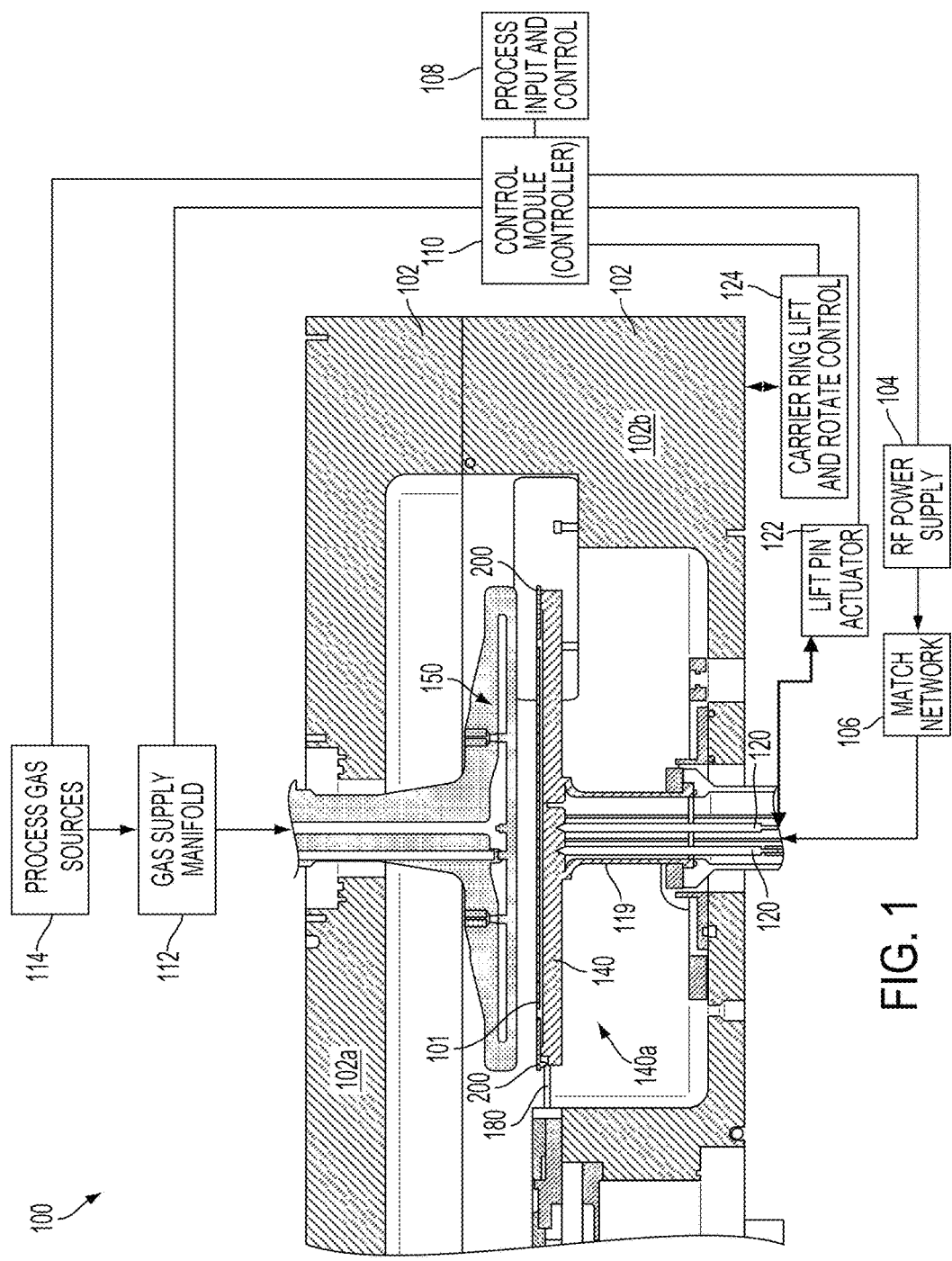
FIG. 1 illustrates a substrate processing system, which is used to process a wafer, e.g., to form films thereon.

Embodiments of the disclosure provide embodiments that define processing chambers that include pedestals modified with circumference filler materials to modify an impedance to plasma returning to ground, via the pedestal edge. In some embodiments, the pedestal is defined from a conductive material, e.g., such as aluminum. The pedestal, in one configuration, is modified to remove an amount of conductive material in the form of an annular step that surrounds the circumference of the pedestal, e.g., in an area under where a carrier ring is to be disposed.

The annular step that results from the removed conductive material can then be filled or replaced with a material having either a different or same conductivity or an insulator, e.g., such as a ceramic. Depending on how the impedance is to be modified for a specific circumference area, the type of material is selected for the filler, which is installed in the step as a filler material. By way of example, the filler may be shaped in the form of an annular ring segment. The annular ring segment may have an arc shape, which is selected based on where the annular ring segment is to be disposed in the area of the step formed in the pedestal. In some embodiments, the annular ring segment may be defined from a ceramic material. In some embodiments, the annular ring segment may be defined from a metallic or conductive material, e.g., aluminum. The complete arc defined by the step around the pedestal can thus be provided with different types of annular segments of different material types, depending on the desired impedance change or influence desired for the arc location.

In one embodiment, a multi-station chamber having pedestals modified with asymmetric fill structures to influence edge impedance and improve azimuthal film uniformity is disclosed. In one configuration, the multi-station chamber includes four stations, and the four stations are arranged in a square configuration with a spindle in a center location. A pedestal for supporting a substrate is provided for each of the four stations, and each pedestal has a pedestal body 140a and a center column 119 is connected in a lower chamber body. Each pedestal includes a carrier ring or focus ring that surrounds a center region of the pedestal that receives substrates for processing. The lower chamber body includes outer walls and inner walls to define a space for each of the pedestals of the four chambers. A spindle at a center location of the chamber is used to lift and move substrates from the pedestals. In some embodiments, the substrates are lifted via a carrier ring, e.g., using spider forks and in other embodiments a paddle system lifts the substrates directly. The rotating mechanism, in either configuration, is interfaced with the pedestal at a location closest to the center location.

In one configuration, the chamber has loading and unloading stations when one wafer is loaded at a time or can include parallel loading and unloading stations where two wafers are loaded and unloaded at a time. As noted above, in some embodiments, the carrier ring may be referred to as a plasma focus ring. In such embodiments, the plasma focus ring functions to focus or optimize the plasma processing across the surface of the substrate, including the edges of the substrate. Generally speaking a plasma focus ring works to extend the outer surface of the substrate so that non-uniformities due to the substrate edge are extended to the outer surface edge of the plasma focus ring (i.e., instead of the substrate edge). In this manner, the edge of the substrate is more uniformly processed, as it will see less or reduced process non-uniformities.

As mentioned above, it is believed that due to the non-symmetric chamber configuration, i.e., which has four pedestals interfaced to the center rotating mechanism, non-uniformity (NU) may be transferred to the deposited films. The NU is sometimes referred to as deposited film "tilting," across the substrate surface. The tilting is a result of films being deposited with varying thicknesses across the substrate surface. Based on testing, it has been discovered that deposited film tilting is related to the position of the substrate relative to the center rotating mechanism. In one embodiment, to offset the tilting, embodiments described herein provide for creating an asymmetric impedance on the pedestal/carrier ring arrangement to influence the impedance in local areas around the circumference of the substrate. As will be described below, one embodiment includes reducing the profile of the aluminum pedestal around the circumference and adding in filler parts (e.g., annular ring segments) of differing material in different zones. Thickness and material type of the filler parts influences the electrical impedance. Metal fillers provide a low impedance path to ground, while dielectric material (ceramic or vacuum) filler plates (e.g., annular ring segments) provide significantly higher impedance.

Process data shows a zone of thinner deposition in approximately an 80-160 degree arc, and sometimes focused in a 120 degree arc, biased toward the spindle of the chamber. This indicates that zone has a different plasma density than the converse zone. In one embodiment, adding a ceramic filler to this zone will increase the impedance to ground, thus reducing the plasma density in that zone compared to the remainder of the pedestal. Alternately, no filler could be added in the e.g., 120 degree arc, which would introduce a vacuum gap and higher impedance to ground.

Current technology is based around an aluminum pedestal, alumina carrier ring and aluminum showerhead combination. Plasma density is influenced by various factors including gas composition, temperature, materials and geometry. When those factors are not axially symmetric, deposited film is often azimuthally non-uniform. The problem is enhanced in the multi-station chamber having a center spindle. Some ways of dealing with this issue is to use symmetric insert/liner, confinement rings and tilted showerheads to improve azimuthal non-uniformity. However, these "global" solutions often fail to provide precise control of NU.

Various examples of these implementations will be shown and described in more detail with reference to the all of the figures and with specific reference to FIGS. 4A-7B. It should be appreciated that the present embodiments can be implemented in numerous ways, such as a process, an apparatus, a system, a device, or a method. Several embodiments are described below.

FIG. 1 illustrates a substrate processing system 100, which is used to process a wafer 101. The system includes a chamber 102 having a lower chamber body 102b and an upper chamber body 102a. A center column 119 is configured to support a pedestal 140, which in one embodiment is a powered electrode. The pedestal 140 is defined by a pedestal assembly that includes the center column 119, and the pedestal body that includes a substrate support surface. As will be defined below, the pedestal body will include an annular step, defined along the circumference of the pedestal body. The annular step is configured to receive two or more annular segments that are selected to either be conductive or dielectric. The annular segments therefore assist in modifying the impedance to ground in an area where the annular segments are placed. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gases, mechanical movement of the wafer 101, etc., such as to deposit or form films over the wafer 101 via ALD methods or PECVD methods.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face which faces that wafer 101 and the wafer 101 resting over the pedestal 140.

Further, the gases may be premixed or not. Appropriate valves and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbo-molecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 226. The carrier ring 200 is therefore lifted along with the wafer 101 and can be rotated to another station, e.g., in a multi-station system. As mentioned above, in some embodiments, the carrier ring 200 is not used for lifting the wafer 101 via spider forks 226. In those embodiments, the wafers 101 are lifted with end effectors (not shown) without moving the carrier ring 200.

As will be appreciated by those skilled in the art, either configuration will benefit from the disclosed embodiments that enable insertion of customized annular ring segments under the carrier ring 200. As noted, certain areas around the pedestal, under the carrier ring 200 can be replaced with either conductive or dielectric annular ring segments, to influence the impedance, which influences the local plasma density and resulting material thickness deposited. Placing the annular segment rings in particular locations relative to the chamber's center spindle can therefore improve azimuthal deposition uniformity over wafers.

Figure 2:
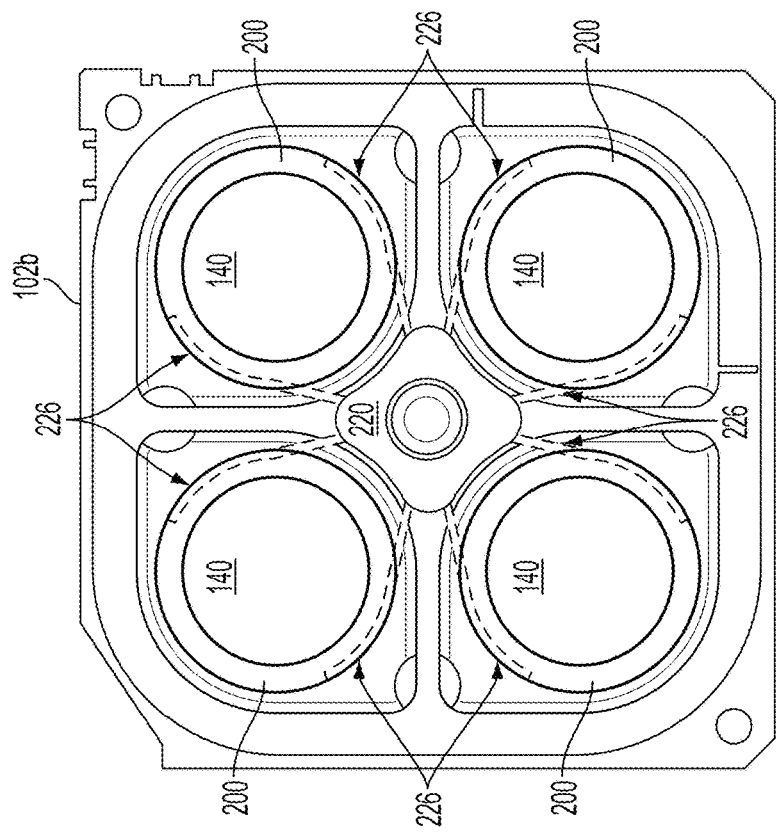
FIG. 2 illustrates a top view of a multi-station processing tool, wherein four processing stations are provided, in accordance with one embodiment.

FIG. 2 illustrates a top view of a multi-station processing tool, wherein four processing stations are provided. This top view is of the lower chamber body 102b (e.g., with the top chamber portion 102a removed for illustration), wherein four stations are accessed by spider forks 226. Each spider fork or forks includes a first and second arm, each of which is positioned around a portion of each side of the pedestal 140. In this view, the spider forks 226 are drawn in dashlines, to convey that they are below the carrier ring 200. The spider forks 226, coupled to a spindle 220 that can rotate and is configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101. Again, embodiments that lift the wafer directly, and not the carrier rings 200 can also implement annular ring segment fillers in the pedestal to influence local impedance to the processing plasma.

Figure 3:
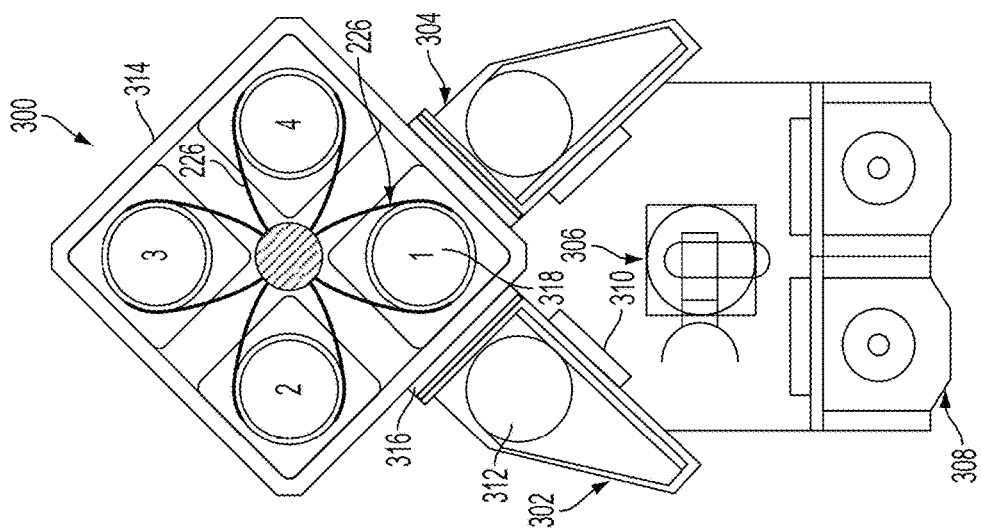
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down.

Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

In some embodiments, a "ring-less" substrate transfer may also be employed. In such embodiments, the "carrier ring" or "plasma focusing ring" remains fixed on one station. The substrate is moved by lifting the substrate off of the pedestal with pins, inserting a paddle under the wafer, and then lowering the substrate on pins thus ensuring direct contact with the paddle to substrate. At this point, the substrate is indexed using the paddle to another station. Once the substrate is at the new station, the substrate is lifted off of the paddle with pins, the paddle is rotated or moved out and the pins are lowered to ensure direct contact of the substrate to the pedestal. Now, the substrate processing can proceed at the new station for the indexed (i.e., moved) substrate. When the system has multiple stations, each of the substrates (i.e., those present at stations) can be transferred together, e.g., simultaneously, in the similar fashion for ring-less substrate transfers.

FIG. 4A illustrates a top view of a segment of the lower chamber body 102b, with one of the pedestal assemblies showing non-uniformities of deposited films over substrate 101. As discussed above, it is believed that the azimuthal non-uniformity of the deposited films over the substrate 101 are at least in part influenced by the non-symmetric positioning of the spindle 220 adjacent to the pedestal body 140a. For illustration purposes, it is shown that particular thicknesses of the deposited films over the substrate 101 can reside in region 406, which is adjacent to or closest to the spindle 220. A region 402, which is opposite the spindle 220 can have a different thickness profile, and so does a region 404. These exemplary regions are shown simply to illustrate that thickness non-uniformities are somewhat related to the positioning of the spindle 220 adjacent to a single side of the pedestal body 140a.

As shown, a carrier ring 200 is positioned around the substrate 101. Underneath the carrier ring 200, two or more annular segments are disposed, within an annular step formed into the circumference of the pedestal body 140a. As a result, it is possible to influence the impedance to ground in the regions around the pedestal body 140a that lie beneath the carrier ring 200. By way of example, it is possible to place, assemble, or insert an annular segment in the region closest to the spindle 220, which has a material composition that will either increase or decrease the impedance in that specific area, which is adjacent to the spindle 220, or opposite the spindle 220. The modification of the impedance in those specific regions will therefore counteract the non-symmetric positioning of the spindle 220, and therefore improve azimuthal uniformity of the films deposited over the wafer 101 in the processing chamber.

FIG. 4B illustrates influencing properties associated with materials used to fill or defined the region under the carrier ring 200, around the pedestal body 140a, in accordance with one embodiment. As shown, a metal fill 410 can be used to define an annular segment that is to be disposed under the region of the carrier ring. When a metallic material is used, e.g., aluminum, and impedance to ground will be reduced. A reduction in the impedance to ground will therefore cause an increase in plasma density over a region of the substrate 101 proximate to the annular segment that is defined from a metallic material. In some embodiments, the increase in plasma density may cause a reduction in film thickness. In other embodiments, depending on the process conditions and processing recipe parameters, the increase in plasma density may cause an increase in film thickness.

By way of example, it is possible to design an annular segment that approximately surrounds region 402 of FIG. 4A. Thus, if region 402 was experiencing thicker deposition in the films being deposited, the inclusion of the annular segment form from a metal fill 410 will cause a reduction in film thickness. Similarly, if the region 406 of FIG. 4A was experiencing thinner deposition films, proximate to the spindle 220, an annular segment can be defined from a ceramic fill 412 (e.g., a dielectric). The ceramic fill 412 will therefore surround at least the area around the substrate 101 proximate to the spindle 220. The annular segment, defined by the ceramic fill 412, will therefore be present below the carrier ring 200 in an adjacent relationship to the spindle 200.

By placing an annular segment defined by a ceramic fill, e.g., dielectric material, in a region that surrounds region 406, the impedance to ground will be increased. Increasing the impedance to ground around the region proximate to region 406, will therefore reduce the plasma density. Accordingly, by selecting the type of material for the annular segments to be disposed around the pedestal body 140a, and the location and arc size, it is possible to influence the impedance to ground so as to compensate for non-uniformities caused by the non-symmetric relationship of the spindle 220 a specific side of the pedestal body 140a.

Figure 6A:
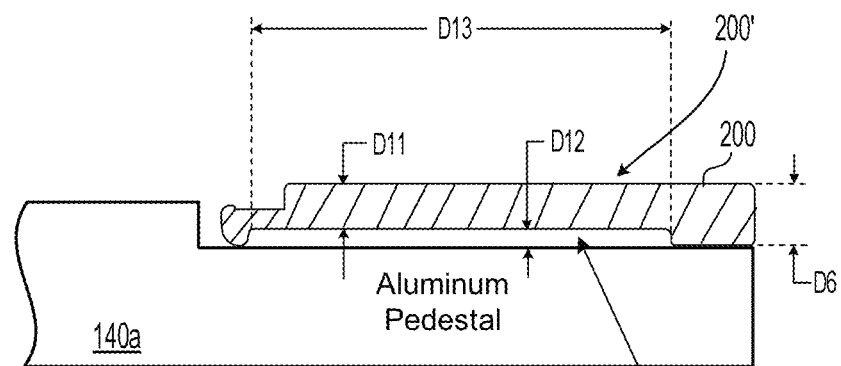
FIGS. 6A and 6B illustrates the use of an air gap defined by a recessed region of the carrier ring, in accordance with one embodiment.
Figure 6B:
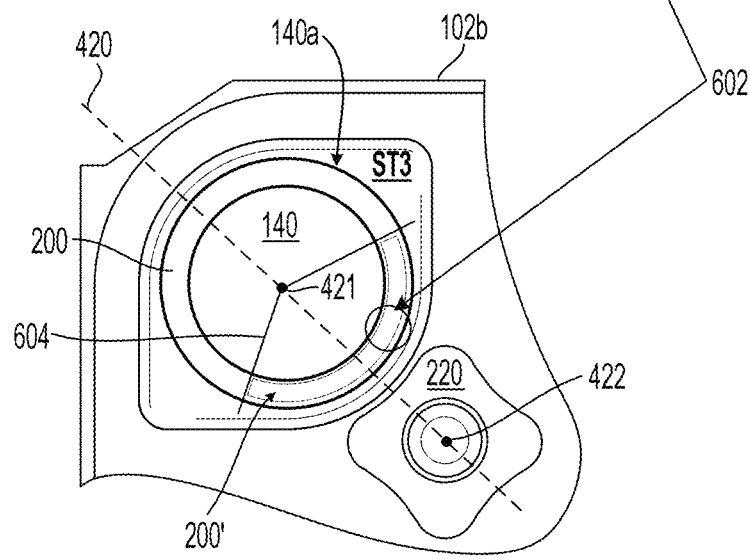

In another embodiment, it is possible to define an air gap 414 under the carrier ring 200. In this example, it is possible to provide an air gap by reducing the thickness of the carrier ring 200, such that a gap exists between the pedestal and the carrier ring 200. The air gap can be defined along an arc region that is strategically placed where an increase in impedance to ground is desired. An example of this configuration is shown in FIGS. 6A and 6B below. Thus, similar to providing a metal fill 410, or a ceramic fill 412, and air gap 414 can assist in increasing the impedance to ground, which influences a reduction plasma density. In some embodiments, it is possible to use a combination of a metal fill 410 and the air gap 414, or a combination of the ceramic fill 412 and the air gap 414, or simply providing air gap 414 over a surface of the pedestal 140, along a circumference.

FIG. 4C illustrates a section of the lower chamber body 102b, that defines an axis 420 extending between a center 421 of the pedestal body 140a and a center 422 of the spindle 220, in accordance with one embodiment. As shown, the influence of the non-symmetric positioning of the spindle 220 relative to the pedestal body 140a, typically has an impact on the surface of the substrate closest to the spindle 220. Some embodiments, the adjacent relationship of the spindle 220 will cause materials to form thicker closer to the spindle 220, and in other embodiments, the adjacent relationship of the spindle 220 will cause materials to form thinner closer to the spindle 220.

Depending on the detected process non-uniformity, or anticipated non-uniformity based on empirical testing or experience, annular segments having either a conductive composition or a dielectric composition can be placed in an annular step formed in the pedestal body 140, and those specific annular segments can be placed centered about the axis 420. For example, the segments can have various arc sizes. In this illustration, the arc sizes are shown as alpha α, beta β, and theta θ. If the non-uniformity is expected or is occurring in a smaller area closer to the spindle 220, the annular segment can have a smaller arc size of theta θ, which can range between 10 and 40 degrees. If the non-uniformity is expected or is occurring in a medium sized area adjacent to the spindle 220, the annular segment can have a medium arc size of beta β, which can range between 40 and 80 degrees.

If the non-uniformity is expected or is occurring in a larger sized area adjacent to the spindle 220, the annular segment can have a larger arc size of alpha α, which can range between 80 and 120 degrees. Once the arc size is defined for the annular segment that is to be centered about the axis 420 in a proximal side 427 that is adjacent to the spindle 220, the arc size of the annular segment that is to be centered about the axis 420 in a distal side 428 that is opposite the spindle 220, can be defined.

Figure 7A:
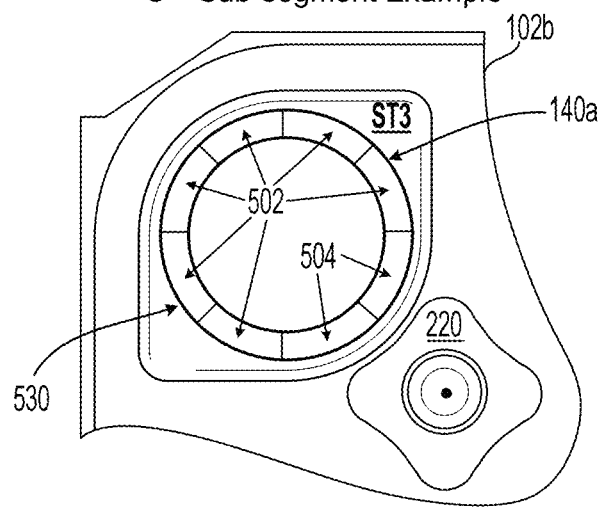
FIGS. 7A and 7B illustrate an example where a plurality of sub-annular segments can be used, in accordance with one embodiment.
Figure 7B:
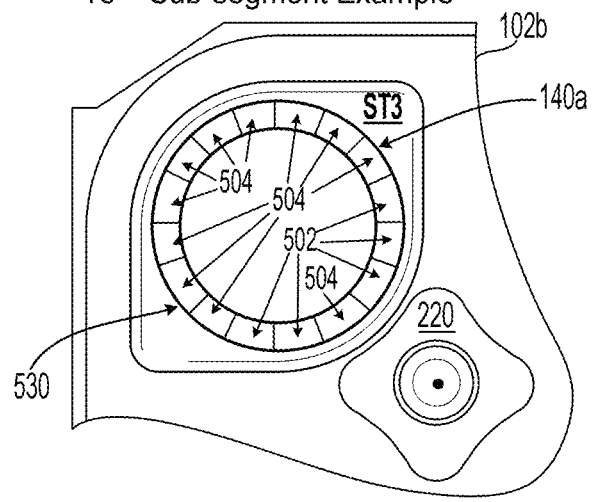

In one embodiment, a first annular segment will be disposed and centered about the distal side 428 about the axis 420, while a second annular segment will be disposed and centered about a proximal side 427 about the axis 420. In still further embodiments, it is possible to fill the annular step of the pedestal body 140a width more than two segments, so long as the annular segments fill the circumference of the annular step of the pedestal body 140a that is to be defined and disposed below the carrier ring 200. An example of providing a plurality of sub-segments is shown in FIGS. 7A and 7B.

FIG. 5A illustrates a three-dimensional diagram of the pedestal body 140a, having a first annular segment 502 and a second annular segment 504, in accordance with one embodiment. In this illustration, it is shown that the second annular segment 504 is defined by a ceramic filler material, which is disposed within, placed within, or assembled onto an annular step formed in the pedestal body 140a. In one embodiment, the annular step is formed in a periphery of the annular body 140a, such that the first and second annular segments can be placed thereon, by mating an opposing annular step of the annular segments. As can be appreciated, the arc size of the first and second annular segments can be modified depending on the amount of material type desired to be placed in the specific regions, e.g., adjacent to the spindle 220 or opposite the spindle 220. In some embodiments, the annular segments, of particular impedance modifying material, can be placed in different locations of the annular step 530 of the pedestal body 140a, depending on where impedance modification is needed to influence process uniformity. As such, in alternative embodiments, the annular segments can have different arc sizes, thicknesses, and placements, which need not be positioned in relation to the spindle 220.

In one specific example, the arc angle 503 for the second annular segment 504 is defined to have a shape that is a segment arc of 120 degrees, while the first annular segment 502 is defined to have a shape that is a segment arc of 240 degrees. In some embodiments, the annular segments can also have different thicknesses, depending on the material and amount of impedance influence desired. In general, no matter how many segments are used to surround the substrate support surface of the pedestal 140, the segments are designed to surround and fill the region around the substrate support surface. Further shown in this example are supports 508, which are used to support pins of a carrier ring 200, when placed over the segments 502 and 504. Depending on the size of the segments 502 and 504, two or one of the supports 508 will reside within a space of the segments. By way of example, the segments can be machined or formed so that the supports 508 can be placed therein.

As mentioned above, the pedestal 140, in one embodiment, is defined from an aluminum material. Therefore, the annular step 530 formed in the aluminum pedestal 140 can be filled with the desired type of filler material, as defined by the annular segments.

FIGS. 5B and 5C show cross-sectional views A-A and B-B of the pedestal body 140a, in accordance with one embodiment. As shown, FIG. 5B illustrates how the second annular segment 504 sits over, within or is placed on the annular step 530 formed into the aluminum pedestal 140, that defines the pedestal body 140a. The second annular segment 504 will have a corresponding and opposing annular step 531, which mates with the annular step 530. In one embodiment, a top surface 537 of the second annular segment 504 is placed to have a plane that is below a plane of the substrate support surface of the pedestal 140. Therefore, the carrier ring 200 can be placed over the second annular ring 504. The similar construction is provided for the first annular segment 502, as shown in FIG. 5C. The annular step 530 is therefore defined by an upper wall 534, and upper step 538, a lower wall 532, and a lower step 536.

In some embodiments, the bottom surface of the annular segments 502 and 504, can have pins, protrusions, or connectors at the upper step 538, so that the annular segments 502 and 504 will be secured to the surface of the annular step 530. That is, the some securing mechanism may be provided so that when the annular segments 502 and 504 are placed in the annular step 530. By way of example, various mechanisms are possible, such as locking connectors, clamps, screws, clips, key-connections, opposing key pins and grooves, mating groove, protrusions and opposing slots or holes, pins, and the like, which can avoid having the annular segment slip off the annular step 530. In other embodiments, the annular segments may simply be disk shape, without the thicker portion around the periphery. For instance, the annular segments may be a flat disk shape having the thickness D1, without the extending portion that has a thickness D5 and width D4. Generally speaking, simply modifying the material with inserts around the annular ring may assist in modifying the impedance to influence better uniformity.

Dimensioning of the first and second annular ring segments can vary, depending on the desired construction, and amount of influence that is desired by the change in impedance to ground. Therefore, the following dimensions are only by way of example, as it relates to a 300 mm system. The sizes may by the same or increase for larger systems, e.g., such as 450 mm systems, or may be the same or decrease for smaller systems, e.g., such as 200 mm systems.

As shown in FIG. 5B, the dimension D1 is between about 1 millimeter (mm) and about 12 mm, and in a specific example about 8.68 mm. The dimension D2 is between about 20 mm and about 40 mm, and in a specific example about 24.2 mm. The dimension D3 is between about 0 mm and about 15 mm, and in a specific example about 13.3 mm. By selecting different D3 values, the vacuum gap will vary. The dimension D4 is between about 1 mm and about 10 mm, and in a specific example about 7.62 mm. The dimension D5 is between about 1 mm and about 30 mm, and in a specific example about 22 mm. The dimension D6 is between about 1 mm and about 4 mm, and in a specific example about 2.7 mm.

Figures 5D, 5E:
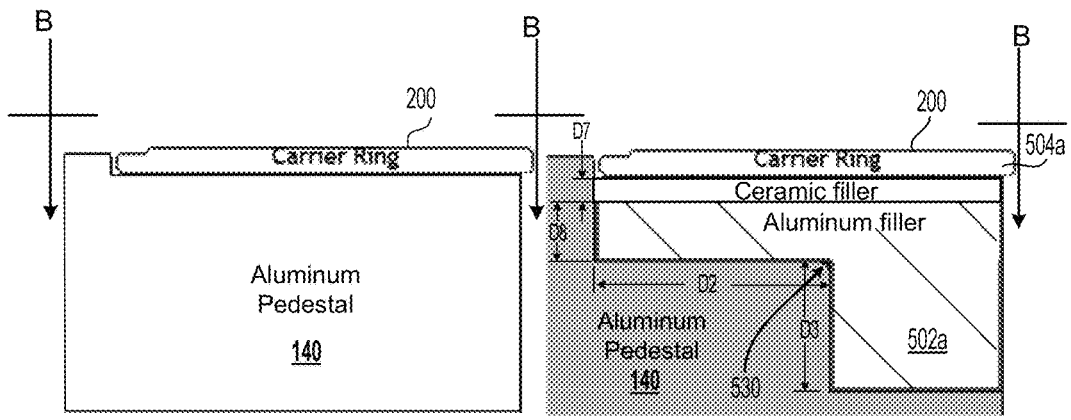

FIG. 5D illustrates another example, where the area in cross-section B-B may be left as the original aluminum pedestal 140, and only the region in cross-section A-A is removed, and filled with a desired annular segment with a dielectric filler material. FIG. 5E illustrates another embodiment, where cross-section B-B may be defined by hybrid implementation, which provides for a first annular segments 502a, with a disk 504a disposed thereon, before the carrier ring 200 is applied. In this example, it is possible to provide ceramic filler that only partially modifies the impedance to ground, e.g., does not increase the impedance to ground as much as a complete filler annular segment.

By way of example, the thickness of the ceramic filler of disk 504a can have dimension D7, which is between about 1 mm and about 10 mm, and in a specific example about 3.0 mm. This would also vary, depending on whether all aluminum or all ceramic or partial material levels or layers of each. The dimension D8 is between about 10 mm and about 1 mm, and in a specific example about 5.68 mm. Again, the sizes are only by way of example, and any implementation can modify the thicknesses, lengths, shapes, cross-sections, steps, geometry, and/or volumes as desired to modify the impedance to ground as necessary to influence the deposition of films over substrates to be in more azimuthal uniformity.

Figure 5F:
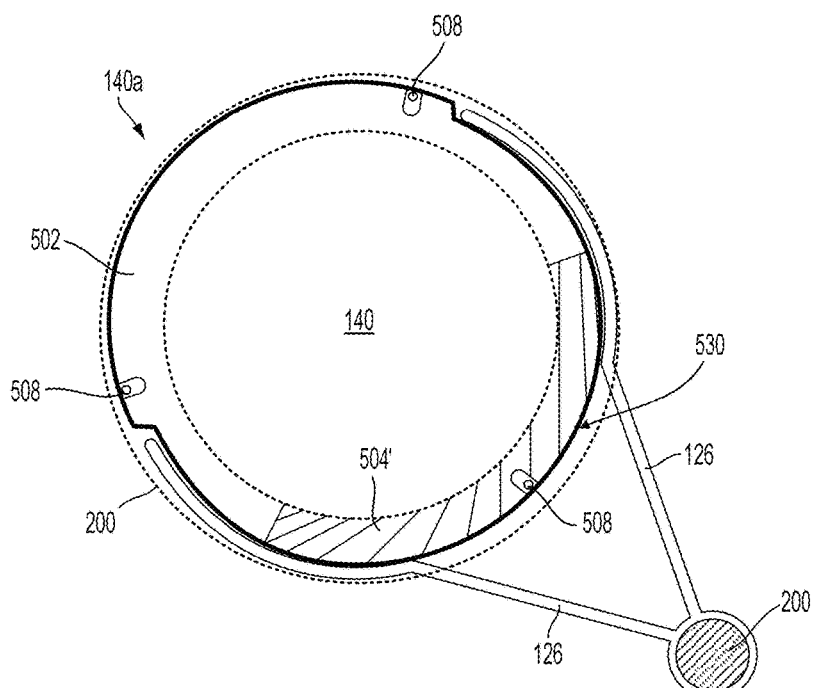

FIG. 5F illustrates an example of a pedestal 140, which has cutouts to enable spider forks 126 to surround a portion thereof, in accordance with one embodiment. This example is one where the spider forks 126, as controlled by spindle 200, can lift the carrier ring 200, to therefore also lift the wafer. In examples where the spindle 200 uses paddles to lift the wafer without moving the carrier ring 200, the pedestal 140 would remain without the cutouts. This example is shown to illustrate that even when the pedestal 140 has cutouts, annular segments can also be placed within annular steps formed in the pedestal body 140a. In this illustration, it is shown that an annular segment 504' has been placed in a location that is adjacent to spindle 200. Although not shown, it is also possible to form an annular step in the pedestal body 140a, to enable an opposite annular segment 502 to be placed around the annular step of the pedestal body 140a.

FIGS. 6A and 6B illustrates the use of an air gap 602 defined by a recessed region of the carrier ring 200', in accordance with one embodiment. In this example, the pedestal 140 does not include an annular step 530, cut out from the pedestal body 140a. Instead, the air gap 602 provides for a change in the impedance to ground seen by the substrate being processed in a location proximate to the air gap 602. As shown in FIG. 6B, the air gap 602 can be defined in an arc region 604 that is proximate to or adjacent to the spindle 220. As shown, an axis 420 is defined along a line between a center 421 of the pedestal 140 and a center 422 of the spindle 220. In one configuration, the arc region 604 of the air gap 602 is centered about the axis 420. In this manner, the air gap 602 can be placed to offset the positioning of the spindle 220 along one side of the pedestal body 140a.

By way of example, FIG. 6A illustrates dimensioning of the carrier ring 200'. These dimensions are only by way of example, and various dimensions or configurations and cutouts can be formed so long as an air gap 602 is formed.

Therefore, dimension D11 is between about 2.5 mm and about 4 mm, and in a specific example about 1.94 mm. The dimension D12 is between about 0 mm and about 1.5 mm, and in a specific example about 0.75 mm. The dimension D13 is between about 1 mm and about 15 mm, and in a specific example about 11.4 mm.

Again, it should be understood that depending on the selected dimensions D1-D13, e.g., for one or more of the parts, other parts and/or dimensions may vary accordingly. As such, the examples provided herein are just that, examples.

FIGS. 7A and 7B illustrate an example where a plurality of sub-annular segments can be used, in accordance with one embodiment.

In this embodiment, modulating impedance in specific zones would be to modify the carrier ring only. Impedance modulation can be done by two ways. The first is to reduce carrier ring thickness, thereby reducing the impedance in the 240 degree arc of the expected thicker deposition region. The second is to add a vacuum gap between the carrier ring and pedestal in the 120 degree arc of thinner deposition, thereby increasing impedance in that zone. For example, FIG. 7A illustrates how eight sub-segments can be placed around the annular step 530 of the pedestal body 140a. By providing the 8 sub-segments, it is possible to define the locations where each segment is positioned. By way of example, second annular segments 504 can be placed proximate to or adjacent to the spindle 220, whereas the second annular segments 502 can fill the remainder of the periphery or circumference of the pedestal body 140a. In FIG. 7B, it is shown how sixteen sub-segments can be used, where first and second annular rings segments can be placed in strategic locations around the circumference of the annular step 530 of the pedestal body 140a. The placement and sizes of the individual segments can vary, and can be placed strategically to offset detected, known, or experienced non-uniformities in azimuthal deposited thicknesses of films.

The example of providing eight segments and sixteen segments are simply that, examples. Some embodiments can include more or less segments, and segments of different arc sizes that do not need to match or equally be divided. In one embodiment, so long as the two or more segments surround the pedestal 140, it is possible to influence and modify the impedance to ground seen by the plasma in the chamber during processing. This modification of the impedance will therefore allow for strategic adjustments to influence a reduction in film thicknesses or increases in film thicknesses in specific regions where non-uniformities have been detected or are expected.

Figure 8:
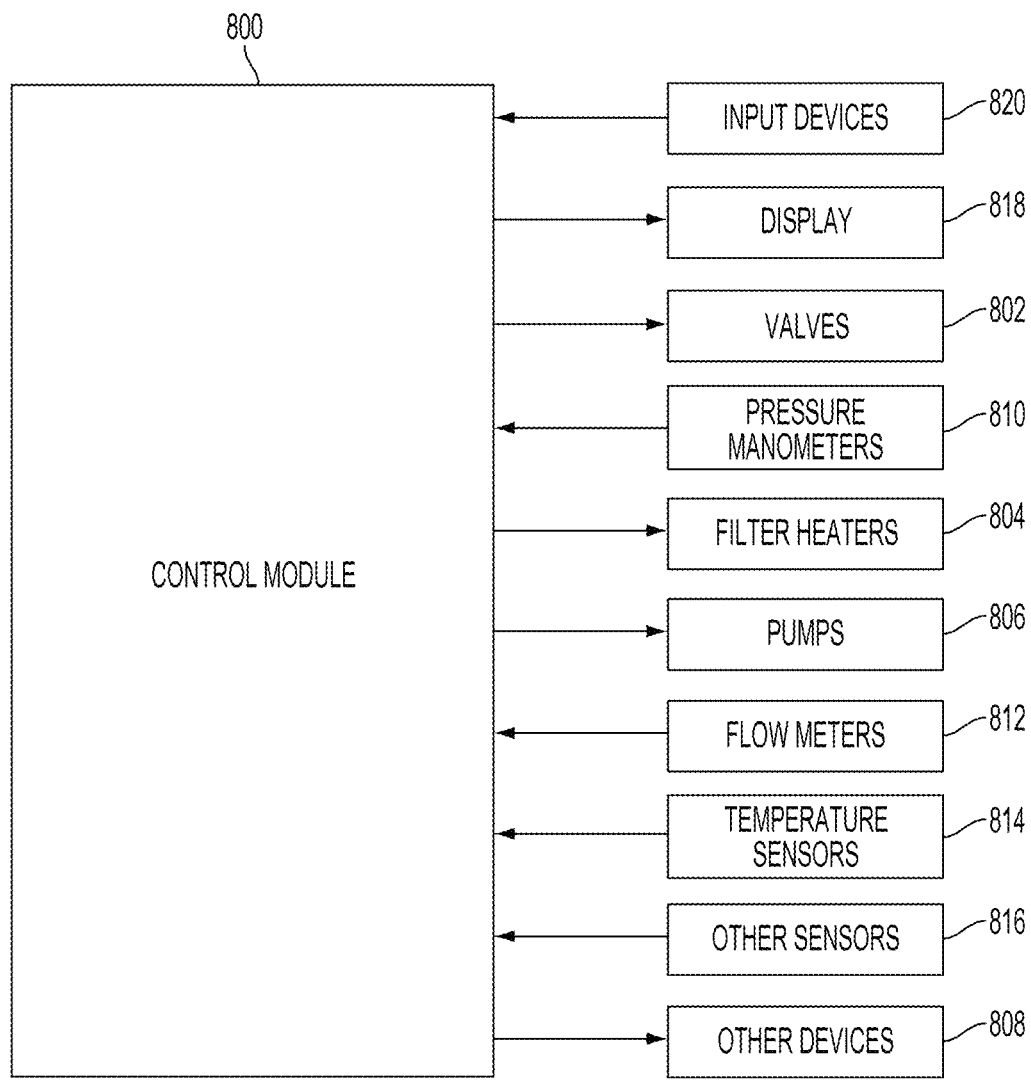
FIG. 8 shows a control module for controlling the systems, in accordance with one embodiment.

FIG. 8 shows a control module 800 for controlling the systems described above. In one embodiment, the control module 110 of FIG. 1 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims.

Accordingly, the present embodiments are to be considered as illustrative and not restrictive, and the embodiments are not to be limited to the details given herein, but may be modified within their scope and equivalents of the claims.

What is claimed is:

1. A pedestal assembly for use in a processing chamber, comprising,
   a center column coupled to a lower chamber body of the processing chamber;
   a pedestal body coupled to the center column, the pedestal body including,
      a substrate support surface;
      an annular step formed around a circumference of the pedestal body and surrounding the substrate support surface;
      a first annular ring segment disposed within the annular step, the first annular ring being defined from a conductive material;
      a second annular ring segment disposed within the annular step, the second annular ring being defined from a dielectric material;
   wherein the first annular ring and the second annular ring fill the annular step around the circumference of the pedestal body;

wherein the processing chamber includes a spindle, the spindle is used to move substrates onto and off of the substrate support surface;

wherein the pedestal body is disposed in the processing chamber in an adjacent relationship to the spindle, such that a center of pedestal body and a center of the spindle are positioned along an axis and the second annular ring segment is centered about a proximal side of the pedestal body along the axis that is adjacent to the spindle and the first annular ring segment is centered about a distal side of the pedestal body along the axis that is opposite the spindle.

2. The pedestal assembly of claim 1, wherein the annular step includes a set of supports, and wherein either or both of the first annular ring or the second annular ring is formed to enable ones of the set of substrate supports to fit therein;

wherein the set of supports are configured to support a carrier ring, the carrier ring is configured to sit over the first annular ring and the second annular ring.

3. The pedestal assembly of claim 1, wherein the first annular segment is defined by a plurality of sub-first annular segments.

4. The pedestal assembly of claim 1, wherein the second annular segment is defined by a plurality of sub-second annular segments.

5. The pedestal assembly of claim 2, wherein the carrier ring includes an air gap in a lower region that faces the pedestal body, the air gap being defined along an arc region around the pedestal body.

6. The pedestal assembly of claim 5, wherein the processing chamber includes a spindle, the spindle is used to move substrates onto and off of the substrate support surface;

wherein the pedestal body is disposed in the processing chamber in an adjacent relationship to the spindle, such that a center of pedestal body and a center of the spindle are positioned along an axis;

wherein the arc region is located adjacent to the spindle and centered about the axis.

7. The pedestal assembly of claim 1, wherein first annular ring segment being defined from the conductive material reduces an impedance to ground and influences an increase in plasma density over a region of the substrate that is proximate to the first annular ring segment when the film is deposited over the substrate in the processing chamber.

8. The pedestal assembly of claim 1, wherein second annular ring segment being defined from the dielectric material increases an impedance to ground and influences a reduction in plasma density over a region of the substrate that is proximate to the second annular ring segment when the film is deposited over the substrate in the processing chamber.

9. The pedestal assembly of claim 1, wherein the first and second annular rings have an annular opposing step that mate with the annular step of the pedestal body.

10. The pedestal assembly of claim 9, wherein the first and second annular rings have a top surface that is spaced below the substrate support surface, wherein a carrier ring is located over the first and second annular rings.

11. The pedestal assembly of claim 10, wherein the processing chamber is a multi-station chamber that includes four of said pedestal assembly;

wherein a spindle is centrally located between each of the four pedestal assemblies;

wherein the second annular ring segments of each of the four pedestal assemblies are positioned adjacent to the spindle and the first annular ring segments of each of the four pedestal assemblies are positioned opposite the spindle.

12. A pedestal assembly for use in a processing chamber, comprising, a center column coupled to a lower chamber body of the processing chamber;

a pedestal body coupled to the center column, the pedestal body including, a substrate support surface;

an annular step formed around a circumference of the pedestal body and surrounding the substrate support surface;

a first annular ring segment disposed within the annular step, the first annular ring being defined from a conductive material;

a second annular ring segment disposed within the annular step, the second annular ring being defined from a dielectric material;

wherein the first annular ring and the second annular ring fill the annular step around the circumference of the pedestal body;

wherein the second annular ring segment has an arc that is between 80 and 160 degrees and the first annular ring segment has an arc that completes 360 degrees, such that the first and second annular ring segments fill the annular step.

13. The pedestal assembly of claim 12, wherein the processing chamber includes a spindle, the spindle is used to move substrates onto and off of the substrate support surface;

wherein the pedestal body is disposed in the processing chamber in an adjacent relationship to the spindle, such that a center of pedestal body and a center of the spindle are positioned along an axis, wherein the second annular ring segment is centered about a proximal side of the pedestal body along the axis that is adjacent to the spindle and the first annular ring segment is centered about a distal side of the pedestal body along the axis that is opposite the spindle.

14. The pedestal assembly of claim 13, wherein first annular ring segment being defined from the conductive material reduces an impedance to ground and influences an increase in plasma density over a region of the substrate that is proximate to the first annular ring segment when the film is deposited over the substrate in the processing chamber, and wherein the second annular ring segment being defined from the dielectric material increases an impedance to ground and influences a reduction in plasma density over a region of the substrate that is proximate to the second annular ring segment when the film is deposited over the substrate in the processing chamber.

15. The pedestal assembly of claim 12, wherein the second annular ring segment has an arc that is about 120 degrees.

* * * * *